United States Patent [19]
Fairbanks

[11] Patent Number: 5,708,565
[45] Date of Patent: Jan. 13, 1998

[54] THERMAL AND SHOCK RESISTANT DATA RECORDER ASSEMBLY

[75] Inventor: Terence M. Fairbanks, Plymouth, Great Britain

[73] Assignee: British Aerospace Public Limited Company, Farnborough, Great Britain

[21] Appl. No.: 673,340

[22] Filed: Jun. 28, 1996

[30] Foreign Application Priority Data

Jul. 1, 1995 [GB] United Kingdom ............... 9 513468

[51] Int. Cl.$^6$ ............................ H05K 7/20; H05K 5/04
[52] U.S. Cl. ............... 361/704; 174/52.2; 206/305; 206/521; 206/811; 220/88.1; 244/1 R
[58] Field of Search ............... 174/52.2; 206/305, 206/521, 811; 220/88.1, 429, 452, 468; 244/1 R; 361/600, 689, 704, 715, 728, 730, 736, 752; 455/96, 98

[56] References Cited

U.S. PATENT DOCUMENTS

| | | | |
|---|---|---|---|
| 3,140,847 | 7/1964 | Ames, Jr. | 244/1 R |
| 3,181,809 | 5/1965 | LoBelle | 244/1 R |
| 4,694,119 | 9/1987 | Groenewegen . | |
| 4,944,401 | 7/1990 | Groenewegen . | |
| 5,123,538 | 6/1992 | Groenewegen | 206/521 |
| 5,438,162 | 8/1995 | Thompson et al. | 174/52.2 |

*Primary Examiner*—Gregory D. Thompson
*Attorney, Agent, or Firm*—Cushman, Darby & Cushman IP Group of Pillsbury Madison & Sutro LLP

[57] ABSTRACT

A thermal and shock resistant data recorder assembly as an outer container (1) containing an inner container (2) which in turn houses one or more data recorder elements (3). The elements (3) which have a thin conformal coating thereon are encapsulated in an innermost cavity (4) of the inner container (2) in an Ester wax material which absorbs heat when changing from a solid to a liquid. An outermost cavity (8) surrounds the innermost cavity (4) in the container (2) and in turn contains a first insulating material which gives off water vapor when heated to absorb heat. Surrounding the inner container (2) in the outer container (1) is a second insulating material. The Ester wax material is enabled to leak when liquid into the outer container and from thence, if necessary, to the exterior of the outer container. This permits pressure equalization. The first insulating material is provided with a fusible material plug which melts under heat and allows the vapor to escape to the exterior of the assembly.

10 Claims, 3 Drawing Sheets

THERMAL AND SHOCK RESISTANT DATA RECORDER ASSEMBLY

FIELD OF THE INVENTION

This invention relates to a thermal and shock resistant recorder assembly particularly, but not exclusively suitable for use as a crash survivable aircraft flight data recorder assembly able to withstand the shock of an aircraft impact and the heat of any resulting fire with little or no damage or loss to the recorded flight data.

BACKGROUND OF THE RELATED ART

Flight data recorders usually incorporate printed electrical cards on which the electronic components are held in place by electrical solder pads to form integrated circuits. Conventionally these printed electrical cards are coated with a thin conformal coating of rubber or plastics material to protect the soldered joints against temperatures which would otherwise cause the solder to melt and the recorded data to be lost. Conventionally such printed electrical cards are protected against heat in many different ways such as by being surrounded in some manner by a material which changes phase from a solid to liquid at a specific temperature to absorb the heat and thereby protect the printed electrical cards against damage. However there is a tendency with conventional assemblies using this technique for the phase change material to exert a wipe-off of shear pressure on the printed electrical cards when liquid sufficient to damage the printed electrical cards and in some instances tear off the connections. Additionally conventional flight data recorder assemblies which are intended to survive an aircraft crash are pressure sealed which has the undesirable effect of exacerbating damage by compression to the printed electrical cards when the phase change heat absorbing material melts.

OBJECTS OF THE INVENTION

Thus one object of the present invention is to provide a generally improved thermal and shock resistant data recorder assembly which at least minimises the foregoing problems.

This and other objects and advantages of the present invention will become more apparent from details disclosed in the following specification where preferred embodiments of the invention are described.

SUMMARY OF THE INVENTION

According to the present invention there is provided a thermal and shock resistant data recorder assembly including an inner container defining an innermost cavity containing at least one data recorder element encapsulated in an Ester wax material operative to absorb heat by liquifaction when the temperature of the assembly exceeds a specific value and an outermost cavity surrounding, but not in communication with, the innermost cavity, which outermost cavity contains a first insulating material operative to absorb heat by release of water vapour when the temperature of the assembly exceeds a specific value, and an outer container housing in the interior thereof the inner container and a surrounding layer of a second insulating material which remains solid when heat is applied to the assembly, and which outer container interior is in fluid flow communication with the exterior thereof, with the innermost cavity being in fluid flow communication with the outer container interior to permit escape thereto of a limited amount of the Ester wax material when liquid to minimise shear damage to at least one data recorder element, with the innermost cavity being in fluid flow communication with the outer container exterior via the outer container interior and second insulating material for pressure equalisation purposes and with at least one fusible material plug being provided between the outermost cavity and the outer container interior operative to allow fluid flow communication, when the temperature of the assembly exceeds a specific value to allow released water vapour to escape from the outermost cavity and outer container interior to the exterior of the outer container.

Preferably the Ester wax material comprises glyceryl tribehenate and calcium benhenate which changes phase from solid to liquid at a temperature in the range of from 105 to 130 degrees C.

Conveniently the first insulating material is magnesium sulphate.

Advantageously the second insulating material is a combination of fibrous material and particulate matter having a low thermal conductivity such as MICROTHERM K (Registered Trade Mark).

Preferably the inner container is in the form of an aluminium box with a removable access cover plate through which is a vent to provide said fluid flow communication.

Conveniently the innermost container box is compartmented to provide said innermost and outermost cavities, with the outer wall bounding the outermost cavity having at least one aperture therethrough provided with said fusible material plug.

Advantageously the fusible material plug is made of an alloy having a melting point of substantially 104 degrees C.

Preferably the outer container is in the form of a titanium box with a removable access cover plate provided with an outlet therethrough for a cable which extends from said at least one data recorder through an outlet from the inner container, which outer container outlet provides the fluid flow communication between the interior and exterior of the outer container.

Conveniently the second insulating material is in the form of a hollow block with one wall removable to permit insertion and removable of the inner container which is spring loaded against said removable wall which in turn bears on the outer container access cover plate.

DESCRIPTION OF THE DRAWINGS

For a better understanding of the present invention, and to show how the same may be carried into effect, reference will now be made, by way of example, to the accompanying drawings, in which.

DESCRIPTION OF EMBODIMENTS OF THE INVENTION

Figure 1:
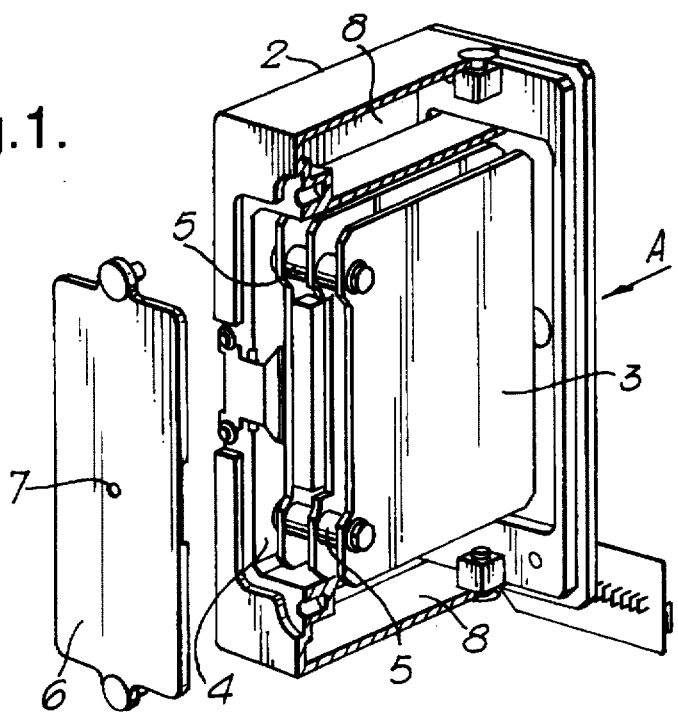
FIG. 1 is a partially exploded perspective view of an inner container and housed data recorder elements forming part of a first embodiment of a thermal and shock resistant data recorder assembly according to the present invention.

A thermal and shock resistant data recorder assembly according to the present invention is primarily intended for use as a crash protected flight recorder memory unit for aircraft. With such an assembly it is necessary for it to withstand impact shock and penetrating forces, contain thermal insulation to form a thermal barrier around an inner data recorder element which must be protected from shock loading and provided with thermal resistance in the form of a heat absorber. To this end the assembly of the present invention basically includes an outer container 1 made of impact resistant material which is preferably titanium and an inner container 2 made of heat conductive material such as aluminium or aluminium alloy within which at least one data recorder element 3 which preferably functions as a memory unit is located. To this end the inner container 2 defines an innermost cavity 4 which can best be seen from 1 of the accompanying drawings which contains at least one data recorder element 3. In the illustrated example three such are shown and there can be more than this if required. These elements 3 are printed electrical cards on which electrical connections are made between components by conventional lead tin solder (approximately 60 percent lead 40 percent tin) which can withstand a temperature up to about 180 degrees Centigrade before melting. The printed electrical cards forming the elements 3 are protected against fluid contamination by the use of a thin conformal coating which preferably is a silicone base coating which does not encapsulate the printed electrical cards. The silicone based coating is preferably less than 0.5 millimeters in thickness and acts to fix the components in place on the cards and ensure no movement occurs during vibration when electrical solder pads are melted. It also prevents contamination of the liquid solder.

Figure 2:
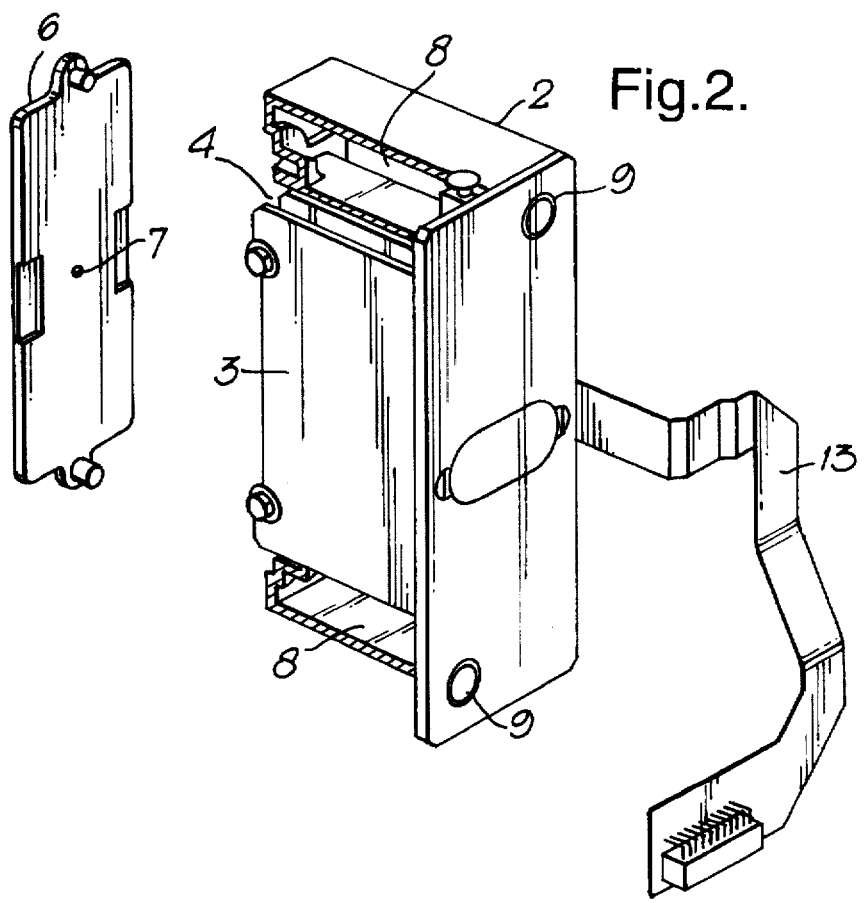
FIG. 2 is a partially exploded perspective view taken in the direction A of the container of FIG. 1.

The or each data recorder element 3 is cushioned against impact shock and insulated against heat transfer by being spaced apart, for example as by spacers 5, and by being encapsulated in an Ester wax material operative to absorb heat by liquifaction when the temperature of the assemblies exceeds a specific value. The wax material is located in the innermost cavity 4 of the inner container 2 and locates the elements 3 spaced from the walls to provide resistance to shock even if the wall defining the innermost cavity 4 should be damaged. The Ester wax material acting as a thermal insulant and heat absorber preferably is composed of glyceryl tribehenate and calcium behenate and is technically known as Tribehenin and Calcium Benehate. A suitable Ester wax available commercially is sold under the name Syncrowax HRS (Trademark). The Ester wax material exhibits a phase change from solid to liquid at a temperature in the range of from 105 to 130 degrees Centigrade and functions also as a protection against shock loading. In its liquid state it provides very low shear properties (low viscosity) over the data recorder elements 3 and as the wax is fluid before the solder softens which prevents break up of the soldered joints on the elements 3. This effect is enhanced by the provision of means enabling a controlled amount of the liquid Ester wax material to escape from the innermost cavity 4 so that the expansion of the wax when it changes from solid to liquid phase does not exert any pressure on the data recorder elements 3 and does not therefore tend to break up the soldered joints. To this end a removable access cover plate 6 which can best be seen in FIGS. 1 and 2 and which is provided to close off the access opening in one end of the box-like aluminium inner container 2 has a vent 7 provided therethrough to allow at all times communication between the innermost cavity 4 and the interior of the outer container 1 in which the inner container 2 is located. Preferably this vent 7 is a three millimeter diameter hole which has the effect of allowing only a minimum of liquid wax material to escape in all orientations of the assembly by exerting a partial vacuum effect. When the Ester wax material is solid the 3 mm hole forming the vent 7 provides pressure equalisation at up to 60 Mega Pascals which is equivalent to immersion of the assembly to a depth of 20,000 feet in sea water.

The inner container 2 also defines between the wall bounding the innermost cavity 4 and an external wall of the container 2 an outermost cavity 8. The outermost cavity 8 surrounds the innermost cavity 4 but is not in communication therewith and contains a first insulating material operative to absorb heat by releasing by release of water vapour when the temperature of the assembly exceeds a specific value. Conveniently the first insulating material is magnesium sulphate which as the formula $MgSO_4 7H_2O$. This absorbs heat and changes state giving off the retained water as steam over the range between 104 to 260 degrees Centigrade. The first insulating material exhibits endothermic properties as it is heated caused by the chemical breakdown of a crystalline structure containing the water molecules into an anhydrous powder. The water thus separated also absorbs its latent heat of vaporisation as it is boiled off as steam. To allow the steam when generated to escape from the inner container 2 it is provided with at least one and preferably two apertures 9 each having a fusible material plug which melts at 104 degrees Centigrade to allow the steam to escape into the interior of the outer container 1.

The outer container I has in the interior thereof around the inner container 2 a layer 10 of a second insulating material which surrounds the inner container 2. The layer 10 of the second insulating material remains solid when heat is applied to the assembly and is conveniently made of a combination of fibrous material and particulate matter having a low thermal conductivity, such as MICROTHERM K (Registered Trademark). The outer container interior 8a is in fluid flow communication with the exterior thereof via a channel 11 through the insulating material 10. The outer container 1 is in the form of a titanium box with a removable access cover plate 12 provided with an outlet therethrough (not shown) for a cable 13 which extends from at least one of the data recorder elements through an outlet (not shown) from the inner container 2. Conveniently the outlet from the outer container 1 for the cable 13 is provided by the gasket 14 connection between the cover plate 12 and the outer container 1. The cover plate 12 is conveniently bolted to the container 1 by bolts 15 and is connected to the container 1 in a manner such as to provide a fluid flow communication between the cover plate 12 and the container 1 sufficient to allow escape of steam, and wax if necessary via the channel 11 to the exterior of the assembly. Additionally this fluid flow communication permits equalisation of pressure between the innermost cavity 4 and exterior of the assembly. Hence the assembly invention is not pressure sealed to ensure survival during deep sea immersion and as such allows the ingress of fluids, liquids and gases to ensure pressure equalisation within the assembly.

Figure 3:
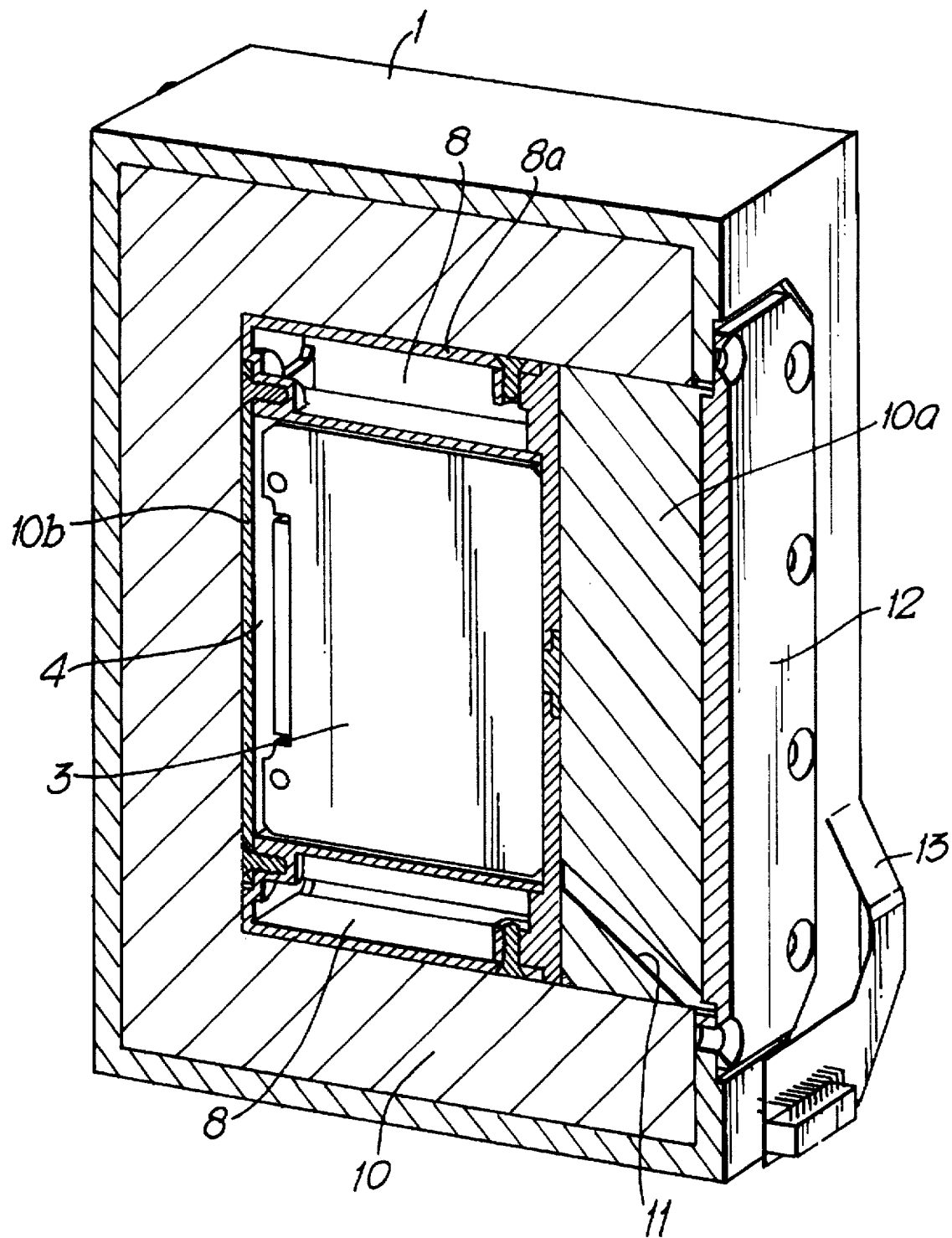
FIG. 3 is a perspective view of part of a thermal and shock resistant data recorder assembly according to a first embodiment of the present invention incorporating the container and elements of FIGS. 1 and 2.
Figure 4:
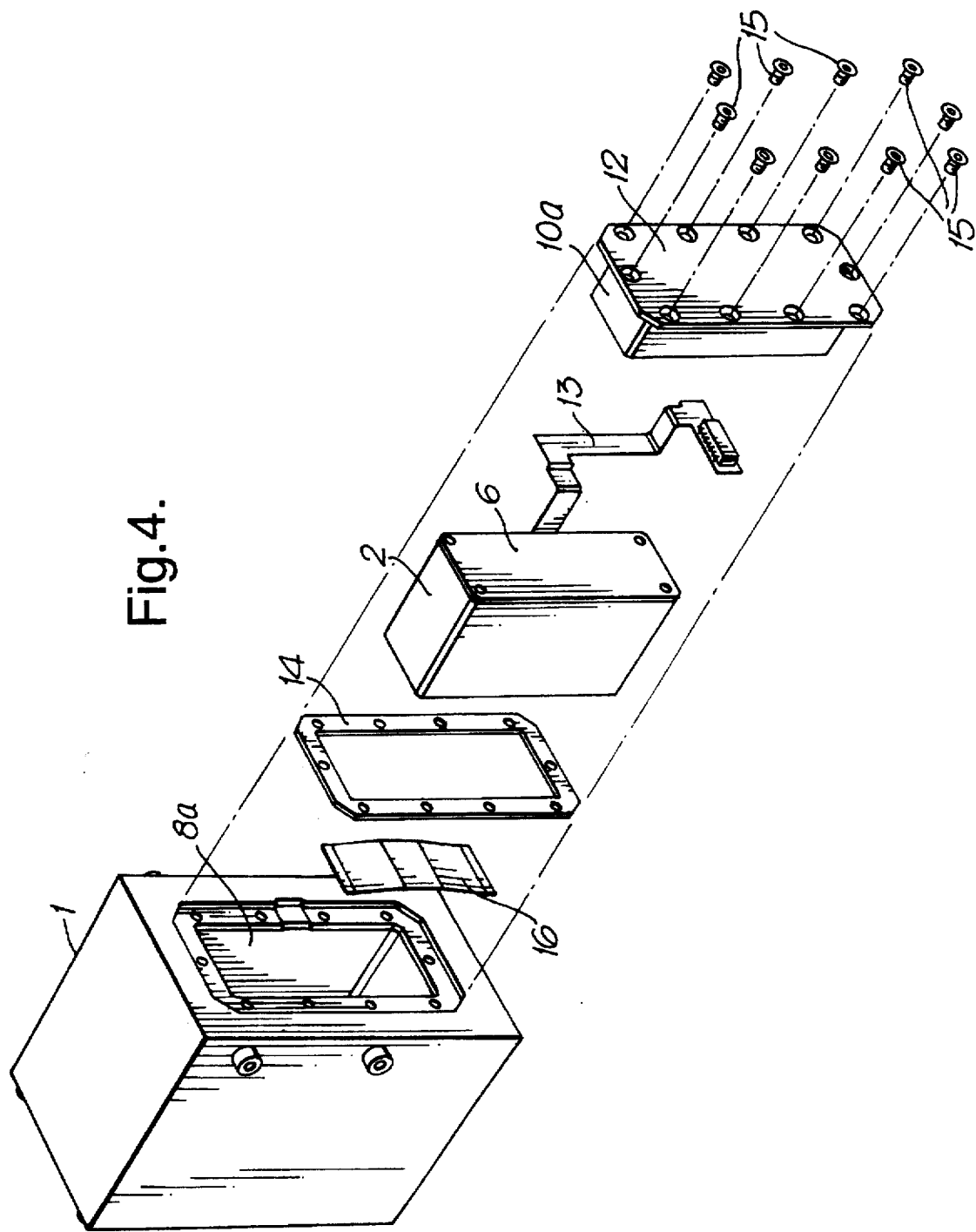
FIG. 4 is a diagrammatic exploded perspective of view of a thermal and shock resistant data recorder assembly of FIGS. 1 to 3 according to the present invention.

As can be seen from FIG. 3 of the accompanying drawings the layer 10 of the second insulating material is in the form of a hollow block with one wall 10a removable to permit insertion and removal of the inner container 2 which is spring loaded against the wall 10a by a spring 16 which is located between an inner wall 10b of the second insulating material opposite to the removable wall 10a and the inner container 2. The container 2 is thus urged against the wall 10a, which in turn bears on the outer container access cover plate.

Thus the assembly of the present invention is not externally sealed against the ingress of fluids or contaminants or of pressure so as to ensure pressure equalisation throughout. As at and above the melting point of the solder on the data recorder elements the encapsulation of the Ester wax material becomes a low shear fluid which together with the conformal coating on the element 3 ensures that the integrated circuits on each element 3 do not move at temperatures above the melting point of the solder. The conformal coating on the or each data recording 3 prevents contamination of the solder when liquid and protects molten solder joints against vibration if the temperature should exceed the melting temperature of the solder.

Various modifications and alterations may be made to the embodiments of the present invention described and illustrated, within the scope of the present invention as defined in the following claims.

What is claimed is:

1. A thermal and shock resistant data recorder assembly including an inner container defining an innermost cavity containing at least one data recorder element encapsulated in an Ester wax material operative to absorb heat by liquifaction when the temperature of the assembly exceeds a specific value and an outermost cavity surrounding, but not in communication with, the innermost cavity, which outermost cavity contains a first insulating material operative to absorb heat by release of water vapour when the temperature of the assembly exceeds a specific value, and an outer container housing in the interior thereof, the inner container and a surrounding layer of a second insulating material which remains solid when heat is applied to the assembly, and which outer container interior is in fluid flow communication with the exterior thereof, with the innermost cavity being in fluid flow communication with the outer container interior to permit escape thereto of a limited amount of the Ester wax material when liquid to minimise shear damage to the at least one data recorder element, with the innermost cavity being in fluid flow communication with the outer container exterior via the outer container interior and second insulating material for pressure equalisation purposes and with at least one fusible material plug being provided between the outermost cavity and the outer container interior operative to allow fluid flow communication, when the temperature of the assembly exceeds a specific value, to allow released water vapour to escape from the outermost cavity and outer container interior to the exterior of the outer container.

2. An assembly according to claim 1, in which the Ester wax material comprises glyceryl tribehenate and calcium behenate which changes phase from solid to liquid at a temperature in the range from 105 to 130 degrees Centigrade.

3. An assembly according to claim 1, in which the first insulating material is magnesium sulphate.

4. An assembly according to claim 1, in which the second insulating material is a combination of fibrous material and particulate matter having a low thermal conductivity.

5. An assembly according to claim 4, in which the second insulating material is a combination of fibrous material and particicluate matter having a low thermal conductivity.

6. An assembly according to claim 1, in which the inner container is in the form of an aluminium box with a removable access cover plate through which is a vent to provide said fluid flow communication.

7. An assembly according to claim 6, in which the inner container box is compartmented to provide said innermost and outermost cavities, with the outer wall bounding the outermost cavity having at least one aperture therethrough provide with said fusible material plug.

8. An assembly according to claim 1, in which the fusible material plug is made of an alloy having a melting point of substantially 104 degrees C.

9. An assembly according to claim 1, in which the outer container is in the form of a titanium box with a removable access cover plate provided with an outlet therethrough for a cable which extends from said at least one data recorder element, through an outlet from the inner container, which outer container outlet provides the fluid flow communication between the interior and exterior of the outer container.

10. An assembly according to claim 9, in which the second insulating material is in the form of a hollow block with one wall removable to permit insertion and removal of the inner container which is spring loaded against said removable wall which in turn bears on the outer container access cover plate.

* * * * *